United States Patent [19]
Yoda et al.

[11] Patent Number: 5,254,872
[45] Date of Patent: Oct. 19, 1993

[54] SEMICONDUCTOR DEVICE AND METHOD OF MANUFACTURING THE SAME

[75] Inventors: Takashi Yoda; Tohru Watanabe; Katsuya Okumura, all of Yokohama, Japan

[73] Assignee: Kabushiki Kaisha Toshiba, Kawasaki, Japan

[21] Appl. No.: 673,265

[22] Filed: Mar. 21, 1991

Related U.S. Application Data

[63] Continuation-in-part of Ser. No. 493,275, Mar. 14, 1990, abandoned.

[30] Foreign Application Priority Data

Mar. 14, 1989 [JP] Japan .................................. 1-61557

[51] Int. Cl.⁵ ............................................. H01L 23/48
[52] U.S. Cl. ..................... 257/751; 257/763; 257/767; 257/486
[58] Field of Search ................. 357/71; 257/751, 763, 257/767, 486

[56] References Cited

U.S. PATENT DOCUMENTS

| | | | |
|---|---|---|---|
| 4,556,897 | 12/1985 | Yorikane | 357/71 |
| 4,910,580 | 3/1990 | Kuecher | 357/71 |
| 4,980,734 | 12/1990 | Inoue | 357/71 |
| 5,070,364 | 10/1991 | McCollum | 357/71 |

FOREIGN PATENT DOCUMENTS 261846 3/1988 European Pat. Off. .
279588 8/1988 European Pat. Off. .

*Primary Examiner*—Robert J. Pascal
*Assistant Examiner*—R. A. Ratliff
*Attorney, Agent, or Firm*—Foley & Lardner

[57] ABSTRACT

A semiconductor device having a reliable contact is disclosed. The device includes a barrier film deposited on the bottom and side wall of a contact hole opened in a insulating film at a predetermined position; a first metal film filled in the contact hole; and a second metal film of low resistance for forming an interconnection which passes above the contact hole filled in with the first metal film. An oxide film is formed by oxidation on the barrier metal film. And a method of manufacturing the semiconductor device is disclosed. The method includes the steps of: after opening a contact hole at a predetermined position in an insulating film deposited on a semiconductor substrate, forming a barrier film in the bottom and side wall of the contact hole; filling the contact hole with a first metal film while heating the semiconductor substrate at a predetermined temperature; and depositing a second metal film over the surface of the semiconductor device and patterning the second metal film to form an interconnection which passes the contact hole that has been filled in with the first metal film.

8 Claims, 5 Drawing Sheets

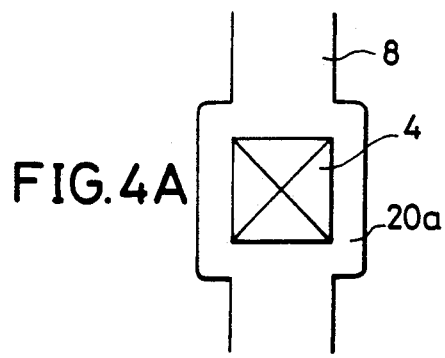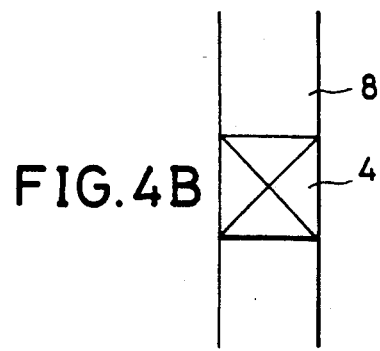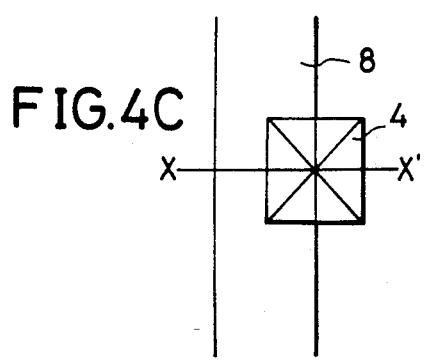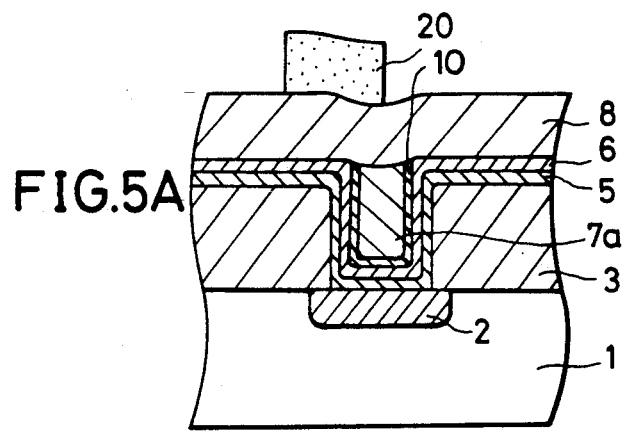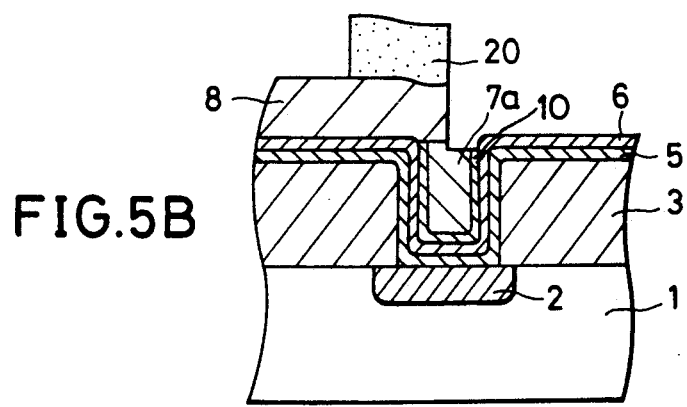

SEMICONDUCTOR DEVICE AND METHOD OF MANUFACTURING THE SAME

This application is a continuation-in-part of application Ser. No. 07/493,275, filed Mar. 14, 1990 now abandoned.

BACKGROUND OF THE INVENTION

The present invention relates to a semiconductor device and a method of manufacturing the same wherein a very small contact hole area is made to have a highly reliable connection.

For high density interconnections of LSIs, films of Al-Si alloy formed by a sputtering method have been mainly used.

In a multi-layer structure of such Al-Si interconnections, there occurs a problem that a void is likely to be formed in an insulating film between interconnection layers.

Furthermore, with a large aspect ratio (depth/width) of a contact hole having a small dimension, the step coverage of an Al-Si film within the contact hole is extremely degraded with possible breakage of interconnection if the film is formed, e.g., by using a DC magnetron sputtering method.

SUMMARY OF THE INVENTION

It is therefore an object of the present invention to provide a semiconductor device and a method of manufacturing the same, and which is capable of retaining a good step coverage of a contact hole even with a high aspect ratio, and high reliability without breakage of interconnection.

According to one aspect of the present invention, there is provided a semi-conductor device comprising a barrier metal film deposited on a bottom and side wall of a contact hole opened in an insulating film deposited on the substrate at a predetermined position. The barrier metal film has an oxide film of the barrier metal thereon. The first metal film fills the hole and a second metal film of low resistance forms an interconnection which passes above the contact hole filled with the first metal film. The barrier metal film suppresses interaction between the first metal film and the substrate insulating film.

According to another aspect of the present invention, there is provided a method of manufacturing a semiconductor device comprising the steps of opening a contact hole at a predetermined position and insulating film deposited on a semiconductor substrate, forming a barrier metal film in the bottom and on the side wall of the contact hole, oxidizing the surface of the barrier metal film to form an oxide film thereon by heating in a mixed atmosphere of oxygen and nitrogen, filing the contact hole with a first metal film by the sputtering method, while heating the semiconductor substrate at a predetermined temperature, and depositing a second metal film over the surface of the semiconductor device and patterning said second metal film to form an interconnection which passes the contact hole that has been filled with the first metal film. The barrier metal film suppresses interaction between the semiconductor substrate, the insulating film and the oxide film, improving its affinity for the first metal film.

With the construction as above, it is possible to retain a good step coverage of a contact hole even with a high aspect ratio, and to have a high reliability without breakage of interconnection.

BRIEF DESCRIPTION OF THE DRAWINGS

In the accompanying drawings,

FIG. 4A is a diagram showing the relationship between a contact hole and an interconnection of a conventional semiconductor device;

FIGS. 4B and 4C are diagrams showing the relationship between a contact hole and an interconnection of a semiconductor device according to the present invention; and FIGS. 5A and 5B are cross sectional views of the semiconductor device shown in FIG. 4C when taken along line X—X'.

DETAILED DESCRIPTION OF THE PREFERRED EMBODIMENT

Figure 1A:
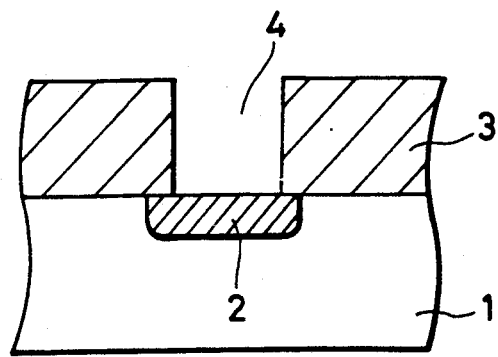
FIGS. 1A to 1C are cross sectional views illustrating the manufacturing steps for a conventional semiconductor device.
Figure 1B:
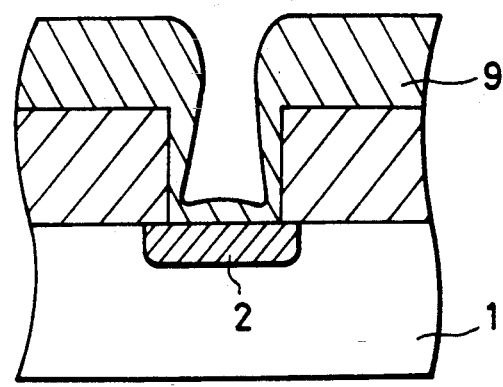

In order to point out the problem associated with a conventional technique, a conventional method of forming a interconnection using Al-Si alloy will be first described with reference to FIG. 1.

An insulating film 3 made of, e.g., $SiO_2$, is deposited on a semiconductor substrate 1 which has impurity diffused regions 2 on the surface thereof at predetermined positions. A contact hole 4 is formed in the insulating film 3 for connection with the impurity diffused region 2 (refer to FIG. 1A). Next, using a DC magnetron sputtering technique, an Al-Si alloy film 9 is deposited and thereafter selectively etched to form an Al-Si interconnection (refer to FIG. 1B). The thickness of the Al-Si film is not uniform throughout the covering area due to the shadowing effect.

Figure 1C:
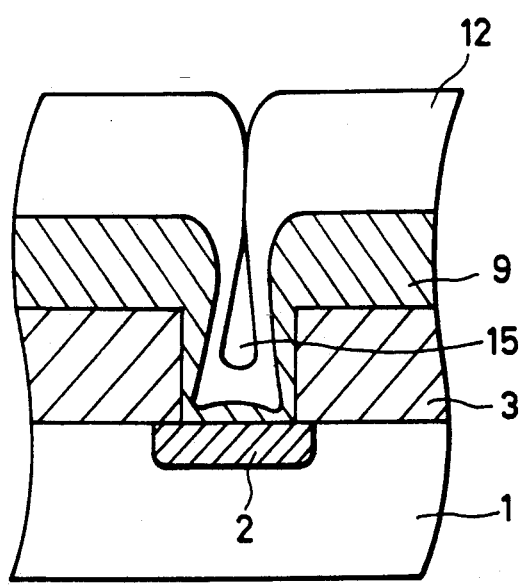

For a multi-layer structure, if an insulating film 12 is further deposited, a void 15 is likely to be formed within the contact hole 4 as shown in FIG. 1C, giving an adverse effect to the upper layer.

Figure 2:
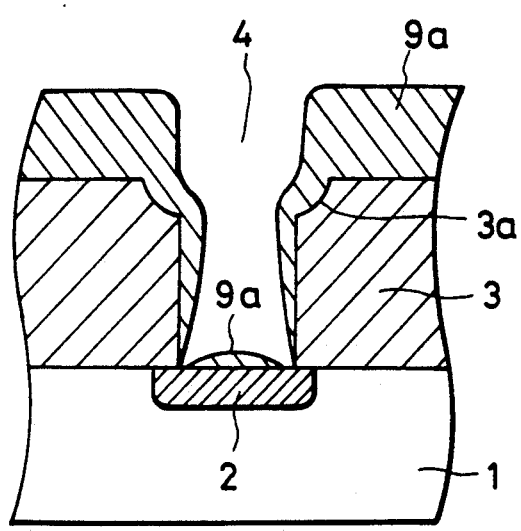
FIG. 2 is a cross sectional view of a conventional semiconductor device having a high aspect ratio.

As shown in FIG. 2, in order to improve the step coverage of an Al-Si film within a contact hole 4 having a small dimension and a large aspect ratio, a round recess 3a is usually formed at the upper edge of the contact hole 4. Even with this round recess 3a, there is a possible breakage of the Al-Si film 9a at the bottom of the contact hole as illustratively shown in FIG. 2 if the aspect ratio of the contact hole becomes great. In addition, even if there is no breakage of an Al-Si film immediately after it was formed, breakage is likely to occur under a poor step coverage due to electro-migration or stress migration, resulting in a low reliability of the interconnection.

An embodiment of the method of manufacturing a semiconductor device according to the present invention will be described with reference to FIG. 3.

Figure 3A:
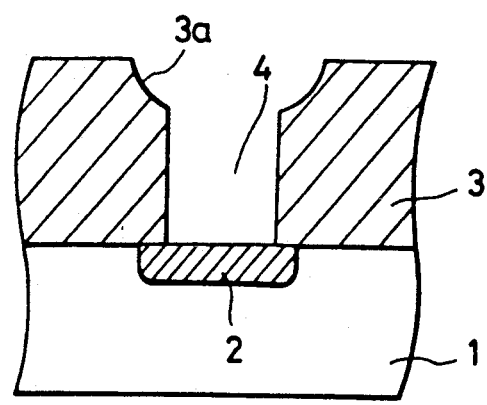
FIGS. 3A to 3G are cross sectional views illustrating the manufacturing steps for a semiconductor device according to the present invention.
Figure 3B:
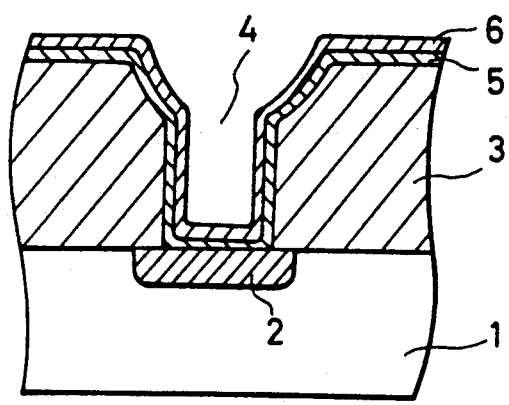
Figure 3C:
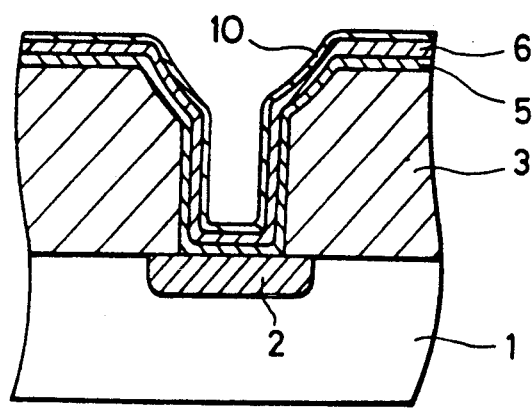
Figure 3D:
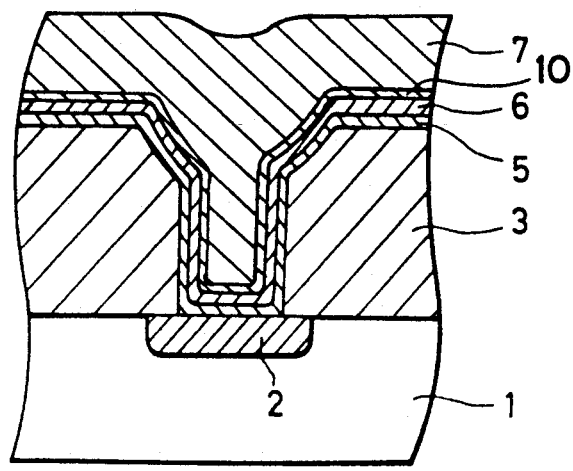

First, an insulating film 3 made of a silicon oxide film having a thickness of, e.g., 1.8 micron, is deposited on a semiconductor substrate made of, e.g., Si. In the insulating film 3, there is formed a contact hole 4 at the position corresponding to an impurity diffused region 2 formed on the surface of the substrate (refer to FIG. 3A). A round recess 3a having a radius of, e.g., 6000 angstroms, is formed at the upper edge of the contact hole 3a (FIG. 3A). Thereafter, on the bottom and side wall of the contact hole 4, there is formed a barrier film made of, e.g., a titanium layer 5 and titanium nitride layer 6 by a sputtering method (refer to FIG. 3B). A Si film having some other transition metal compound as its main content can be used as the barrier metal.

The barrier metal may be formed by a CVD method.

The substrate is then heated at a temperature of approximately 500° to 600° C. in an atmosphere of mixed gaseous oxygen and nitrogen. By this process, an oxide film of Ti 10 having a thickness of 100 Å is formed (refer to FIG. 3C). While maintaining the substrate at a predetermined temperature (e.g., within the range from about 500 degrees centigrade to 550 degrees centigrade), an Al-Si film 7 is deposited by means of a magnetron sputtering method so that it is filled in the contact hole 4 (refer to FIG. 3D). In this case, the migration effect of particles sputtered from the target is enhanced so that the contact hole 4 can be filled in with the Al-Si film 7 without forming a void therein. If the substrate is heated to 550 degrees centigrade or higher, the Al-Si film 7 is once melted and then solidified so that it is formed within the contact hole in the shape of a spherical lump because of the surface tension thereof. Alternatively if the substrate is heated to 500 degrees or lower, the migration effect of the Al-Si film 7 at the surface of the substrate is less so that the contact hole 4 having a high aspect ratio cannot be sufficiently filled in with the Al-Si film 7.

The temperature range from 500 degrees centigrade to 550 degrees centigrade is preferable because TiSi film having a low resistivity is formed by interaction between the Ti and Si, thereby improving the performance of the device.

The barrier film made of the Ti layer 5 and TiN layer 6 presents the following two functions when the Ai-Si film is being formed.

Firstly, the interaction between the Al-Si film 7 and Si of the substrate 1 and insulating film 3 is suppressed so that junction breakage can be avoided.

Secondly, the TiN layer 6 absorbs infrared ray so that the substrate 1 can be heated efficiently from the bottom surface thereof.

Thirdly, since the TiN layer has good affinity for the Al-Si film, it shows good wetability for the Al-Si film.

An alloy of Al and 1% Si is most suitable for the target material. Pure Al or Al-Si alloy having a high content of Si has a narrow temperature margin and so is not suitable for practical use.

It is also preferable to enlarge the distance between the substrate and target and to increase the amount of sputtering particles incident to the contact hole in the vertical direction. Under this condition, it is possible to fill the contact hole 4 having even a high aspect ratio without forming a void near at the bottom of the contact hole.

The Al-Si film 7 has a grown-up large diameter of crystalline particles of about 10 microns. Consequently, there is the possibility that the Al-Si film 7 has a strong resistance against electro migration but a weak resistance against stress migration. In addition, high resistance Si is crystallized at interfaces between crystalline particles of the Al-Si film 7, resulting in an increased interconnection resistance and a difficulty in using the Al-Si film as a interconnection. It therefore becomes necessary to remove the Al-Si film at areas other than the contact hole area.

Figure 3E:
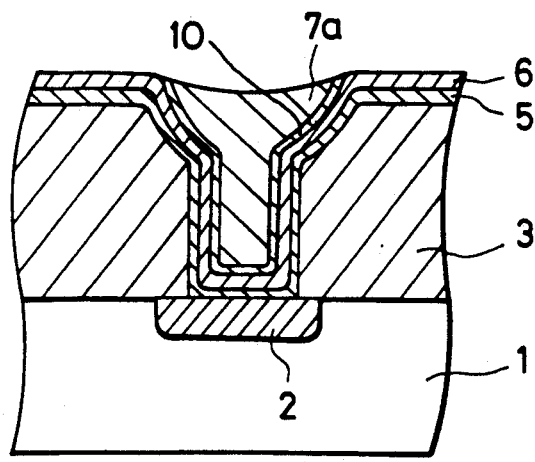
Figure 3F:
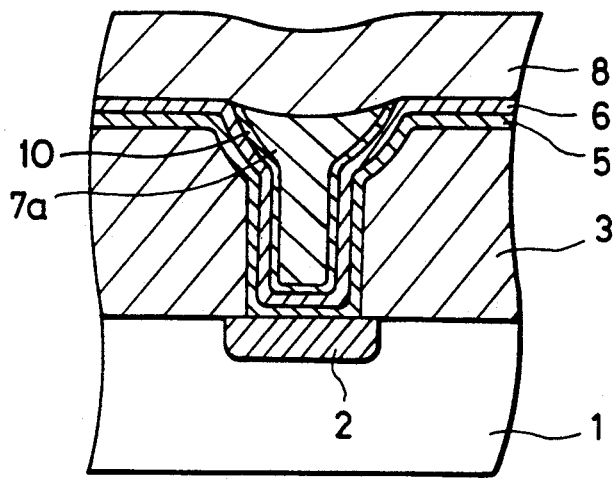
Figure 3G:
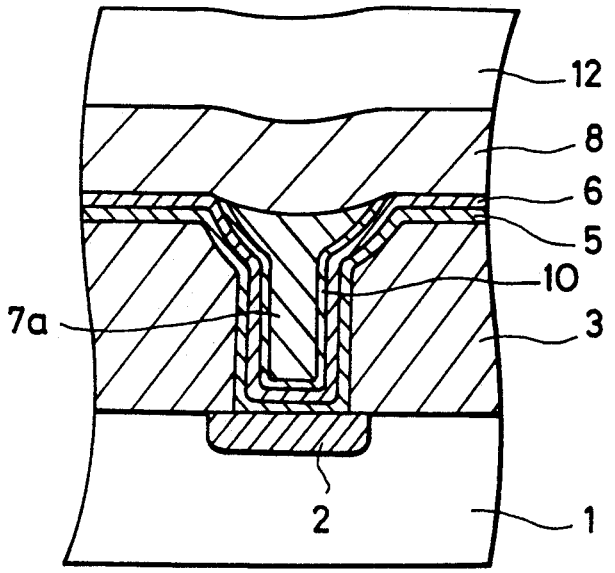

After forming the Al-Si film 7, it is etched off using phosphoric acid to leave the Al-Si film 7a only within the contact hole (refer to FIG. 3E). Thereafter, the surface of the Al-Si film 7a and TiN film 6 is etched with Ar ions to remove a natural oxide film. An Al-Si-Cu film for use as interconnections is deposited for 8000 angstrom in a vacuum atmosphere (refer to FIG. 3). In the above manner, highly reliable interconnection can be formed even on a contact hole 4 having a high aspect ratio and without any breakage of interconnection. Thereafter, the Al-Si-Cu film 8 is patterned to form desired interconnections, and an insulating film 12 is formed thereon, the insulating film capable of being formed without any voids (refer to FIG. 3G).

As appreciated from the foregoing description of the embodiment, it is possible to realize a semiconductor device having a good step coverage of a contact hole even it has a high aspect ratio, and high reliability without breakage of interconnection.

A conventional interconnection pattern requires a contact margin 20a at the peripheral portion of the contact hole 4 as shown in FIG. 4A. This invention makes it unnecessary to have such a contact margin as shown in FIG. 4B, thereby allowing finer interconnections. The reason for this is as follows. As shown in FIG. 4C and FIG. 5A showing the cross section taken along line X—X' of FIG. 4C, even if an interconnection 8 and a contact hole 4 are not aligned correctly, the Al-Si film 7a filled in the contact hole 4 operates to prevent over-etching during patterning of the interconnection 8 by means of anisotropic etching.

The present invention when applied to a multi-layer structure, can realize a highly reliable device having a void-free interlayer insulating film above a contact hole.

In the above embodiment, Al-Si alloy has been used for filling a contact hole. Other alloys of low melting point may also be used. It is particularly preferable to use Cu-based alloy because it has a good fluidity.

What is claimed is:

1. A semiconductor device comprising:
   a substrate;
   an unsulating film deposited on the substrate at a predetermined position;
   a contact hole formed in said insulating film;
   a barrier metal film deposited on an entire bottom and an entire side wall of the contact hole, said barrier metal film having an oxide film of said barrier metal thereon;
   a first metal film filled in said contact hole, said first metal film having a good fluidity when it is deposited; and
   a second metal film of low resistance for forming an interconnection which passes above said contact hole filled in with said first metal film,
   said barrier metal film suppressing interaction between said first metal film and the insulating film and
   said oxide film improving its affinity for the first metal film.

2. A semiconductor device according to claim 1, wherein said first metal film is made of an alloy having a low melting point.

3. A semiconductor device according to claim 1, wherein said barrier film is made of a film having a transition metal compound as its main component.

4. A semiconductor device according to claim 2, wherein said alloy having an aluminum-based alloy.

5. A semiconductor device according to claim 1, wherein said second metal film is made of an aluminum-silicon-copper-based alloy.

6. A semiconductor device according to claim 1, wherein said barrier metal film is composed of a transition metal film and nitride film of the transition metal.

7. A method of manufacturing a semiconductor device comprising the steps of:

opening a contact hole at a predetermined position in an insulating film deposited on a semiconductor substrate;

forming a barrier metal film in the bottom and side wall of said contact hole;

oxidizing the surface of the barrier metal film to form an oxide film thereon by heating in a mixed atmosphere of oxygen and nitrogen;

filling said contact hole with a first metal film by sputtering method while heating said semiconductor substrate at a predetermined temperature; and depositing a second metal film over the surface of the semiconductor device and patterning said second metal film to form an interconnection which passes said contact hole that has been filled in with said first metal film;

said barrier metal film suppressing interaction between said first meal film and the insulating film, and said oxide film improving its affinity for the first metal film.

8. A method of manufacturing a semiconductor device according to claim 7, wherein said step of forming a barrier metal film is performed by a sputtering method.

* * * * *